United States Patent
Lacey (10) Patent No.: US 8,487,609 B2
(45) Date of Patent: Jul. 16, 2013

(54) TESTING APPARATUS WITH READ HEAD HOLDER HAVING A GAS JET POINTING INTO A CHANNEL

(75) Inventor: Christopher Allen Lacey, Saratoga, CA (US)

(73) Assignee: Microphysics, Inc., San Diego, CA (US)

(*) Notice: Subject to any disclaimer, the term of this patent is extended or adjusted under 35 U.S.C. 154(b) by 279 days.

(21) Appl. No.: 12/968,078

(22) Filed: Dec. 14, 2010

(65) Prior Publication Data
US 2012/0146631 A1 Jun. 14, 2012

(51) Int. Cl.
*G01R 33/12* (2006.01)
(52) U.S. Cl.
USPC ............................ 324/210; 324/212
(58) Field of Classification Search
USPC ................................ 324/210–212
See application file for complete search history.

(56) References Cited

U.S. PATENT DOCUMENTS

| | | | |
|---|---|---|---|
| 3,435,441 A * | 3/1969 | Stahler | 360/221 |
| 4,747,006 A * | 5/1988 | Miwa et al. | 360/130.3 |
| 5,543,973 A * | 8/1996 | Moriyama | 360/17 |
| 5,696,653 A | 12/1997 | Lacey | |
| 5,758,406 A | 6/1998 | Hunsaker et al. | |
| 5,818,658 A * | 10/1998 | Balster et al. | 360/75 |
| 6,222,705 B1 * | 4/2001 | Stupp et al. | 360/291.6 |
| 6,236,201 B1 * | 5/2001 | Kilicci et al. | 324/212 |
| 6,237,215 B1 | 5/2001 | Hunsaker et al. | |
| 6,459,260 B1 | 10/2002 | Bonin et al. | |
| 6,765,379 B1 * | 7/2004 | Marshall et al. | 324/210 |
| 6,903,543 B2 | 6/2005 | Boutaghou et al. | |
| 6,943,971 B2 | 9/2005 | Kainuma et al. | |
| 7,165,462 B2 | 1/2007 | Luo et al. | |
| 7,196,512 B2 | 3/2007 | Kainuma et al. | |
| 7,355,393 B2 | 4/2008 | Tokutomi et al. | |
| 7,504,038 B2 | 3/2009 | Bietsch et al. | |
| 7,520,047 B2 | 4/2009 | Collins et al. | |
| 7,622,915 B2 | 11/2009 | Sugiyama et al. | |
| 7,643,249 B2 | 1/2010 | Motonishi et al. | |
| 7,719,796 B2 | 5/2010 | Takahashi et al. | |
| 2002/0069510 A1 | 6/2002 | Girard et al. | |
| 2004/0104722 A1 | 6/2004 | Kainuma et al. | |
| 2006/0236527 A1 * | 10/2006 | Davis et al. | 29/603.12 |
| 2008/0062564 A1 | 3/2008 | Warn | |
| 2009/0268329 A1 | 10/2009 | Nojima | |

FOREIGN PATENT DOCUMENTS

| | | |
|---|---|---|
| WO | 9612971 A1 | 5/1996 |
| WO | 2006116047 A2 | 11/2006 |

OTHER PUBLICATIONS

Directed Air Jet Head Loading Mechanisem; IBM Technical Disclosure Bulletin; Aug. 1970; vol. 13; Issue 3; p. No. 702.*

* cited by examiner

*Primary Examiner* — Jay Patidar
(74) *Attorney, Agent, or Firm* — Joshua C. Harrison, Esq.; Barcelo, Harrison & Walker, LLP (57) ABSTRACT

A test apparatus can test a read head and/or a disk. The test apparatus includes a rotatable spindle adapted to hold the disk, and a holder oriented to hold the read head with its air bearing surface adjacent the major surface of the disk during testing. The holder includes a channel with a first side wall. The channel defines a channel longitudinal axis parallel to the first side wall. The channel also defines a lateral direction that is normal to the first side wall. A first gas jet points into the channel and impinges upon a top face of the read head.

20 Claims, 6 Drawing Sheets

TESTING APPARATUS WITH READ HEAD HOLDER HAVING A GAS JET POINTING INTO A CHANNEL

FIELD

The present disclosure relates generally to testing apparatuses for heads used in information storage devices, and in particular to head fixtures for such testing apparatuses.

BACKGROUND

Many commercially important information storage devices include one or more read heads that can read information from rotating disk media (e.g. one or more magnetic or optical disks). Read heads may perform various functions in addition to reading, such as writing information to the disk media, establishing and maintaining a desired physical separation from the disk media, etc. However, for convenience such multifunctional heads will be referred to as a read heads herein. A typical read head includes a slider and a read transducer disposed on a trailing face of the slider. The read transducer is typically part of a merged transducer that may include features and structures to accomplish other functions as well, such as writing, lapping control, heating, and/or microactuation. However, for convenience the entire merged transducer will be referred to as a read transducer herein.

Since the read transducer is much smaller than the slider upon which it is disposed, the entire read head (including both slider and read transducer) is often simply referred to in the art as a "slider," especially in the context of physical tooling that is used to hold or position the read head. Hence, many structures that are described in the art to hold or support a "slider" are actually used to hold or support an entire read head, including the read transducer that is disposed on its trailing face Likewise, one may describe faces of the read head with terms that are interchangeable with terms used to describe faces of the slider component of the read head. For example, the "air bearing surface" of a read head is the same as the "air bearing surface" of the slider component of that read head. Opposite of the air bearing surface is the top face of the slider or read head. Opposite the trailing face is the leading face of the slider or read head.

The air bearing surface of the read head (i.e. of the slider component of the read head) is typically designed to establish a hydrodynamic lubrication layer known as an "air bearing" between the slider and the rotating disk media. Often the slider is described to be "flying" over the disk media, because it is separated from the disk media by the air bearing. The air bearing is considered to be self-pressurizing since it results from the relative motion between the read head and the disk media, rather than being externally pressurized by any external pressure source. Note that the hydrodynamic lubrication layer is typically referred to in the art as an "air bearing," and the adjacent slider surface is typically referred to as the "air bearing surface," even when the surrounding gas (and therefore the hydrodynamic lubrication layer as well) comprises an alternative gas such as helium rather than merely air. For example, although an atmosphere comprising mostly helium is not the same as "air," the same "air bearing" terminology is used in the art in both contexts for convenience.

Various methods and structures have been disclosed in the art to temporarily hold read heads or "sliders" while they are under test. For example, there have been several disclosures in the art of suspension spring assemblies that include slider clamps or slider sockets that can temporarily hold (and possibly also provide temporary electrical connection to) read heads while under test. Such disclosures include U.S. Pat. No. 6,459,260 to Bonin et al., U.S. Pat. No. 6,903,543 to Boutaghou et al., U.S. Pat. No. 7,719,796 to Takahashi et al., and U.S. Pat. No. 7,643,249 to Motonishi et al.

However, to properly hold the slider during testing, such suspension spring assemblies are necessarily diminutive, compliant, and lightweight, and therefore quite fragile. Consequently, such suspension spring assemblies are easily physically damaged and difficult to use repeatedly as a testing fixture without being damaged. The care in use that is required may be too time consuming for a high volume production-level testing environment. Even while attempting such care, the replacement of such fragile test fixtures may be required too frequently for the fixtures to be practically desirable in such an environment. Hence, although diminutive, compliant, and lightweight suspension springs have been very successful as information storage device components that are intended for one-time assembly, they are not very practical for use as test fixtures that are intended for frequent re-use.

Other methods and structures that have been disclosed in the art to temporarily hold read heads or "sliders" while they are under test, couple a massive component to the slider (that must move with slider). Such coupling of a massive component to the slider can change the dynamic characteristics of the slider/hydrodynamic lubrication layer system (i.e. the so-called "flying" behavior of the slider). For example, the hemispheric base 80 disclosed in U.S. Pat. No. 7,196,512 to Kainuma et al. is more massive than the slider 10 itself, and changes the flying behavior of the slider 10 under test. Such change to the flying behavior of the slider is undesirable since it can affect the read head test results—making the test results different than what would be expected during normal operation of the read head in the storage device.

Therefore, there is a need in the art for a test apparatus that can temporarily hold a read head during testing, that is practically adaptable to a high volume production-level testing environment, and that does not couple a massive component to the slider (that must move with slider).

SUMMARY

A test apparatus can test a read head and/or a disk. The test apparatus includes a rotatable spindle adapted to hold the disk, and a holder oriented to hold the read head with its air bearing surface adjacent the major surface of the disk during testing. The holder includes a channel with a first side wall. The channel defines a channel longitudinal axis parallel to the first side wall. The channel also defines a lateral direction that is normal to the first side wall. A first gas jet points into the channel and impinges upon a top face of the read head.

DESCRIPTION OF THE EXAMPLE EMBODIMENTS

Figure 1:
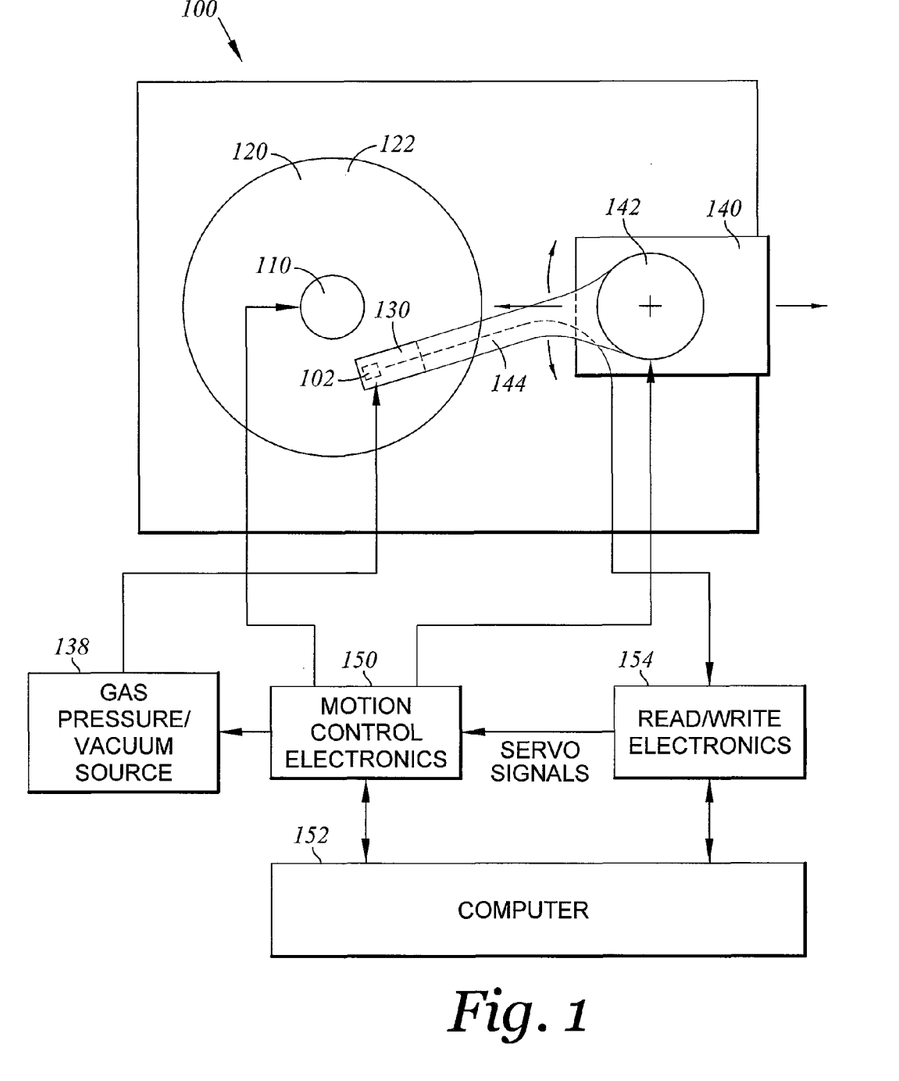
FIG. 1 depicts a test apparatus according to an embodiment of the present invention.

FIG. 1 depicts a test apparatus 100 according to an embodiment of the present invention. The test apparatus 100 includes a rotatable spindle 110 and a disk 120 attached to the rotatable spindle 110. The rotable spindle 110 may be a high precision ball bearing spindle or an air bearing spindle, for example, and is preferably driven by a motor that may be controlled by motion control electronics 150 to rotate at nearly constant rotational speeds selectable in the range 3000 rpm to 15000 rpm. The disk 120 includes a major surface 122. The disk 120 may be a disk that is under test. For example, the major surface 122 of the disk 120 may include one or more magnetic layers or protective layers that are the subject of the test. The disk 120 may be a magnetic hard disk, an optical disk, a magneto-optical disk, a glass disk used for interferometric flying height measurement, etc.

The test apparatus 100 of FIG. 1 also includes a holder 130 for holding a read head 102, and a gas pressure source 138 that is coupled to a gas jet of the read head holder 130. The gas pressure source 138 can preferably selectively provide super-ambient pressure to drive the gas jet. In certain embodiments, the gas pressure source 138 may also be capable of selectively providing sub-ambient pressure to the gas jet. Such sub-ambient pressure may be informally referred to as "vacuum," and may be used to temporarily suck the read head into the channel (and thereby hold the read head when the read head is not loaded onto the disk).

The test apparatus 100 may also include a translational positioning stage 140, and/or a rotational positioning stage 142, coupled to an arm 144 to which the read head holder 130 is attached. The translational and/or rotational positioning stages 140, 142 are capable of coarse translation and/or rotational actuation of the read head holder 130 to change its position and/or orientation with respect to the major surface 122 of the disk 120. A computer 152 may run test software that accepts instructions from a graphical user interface, and directs the motion control electronics 150 to control the translational positioning stage 140, the rotational positioning stage 142, and/or the rotation of the spindle 110.

The disk 120 may be a standard disk or a benchmark disk with known characteristics that facilitate testing of the read head 102, but where the disk 120 is not itself the primary subject of the test. Alternatively, the disk 120 may be the primary subject of the test, and/or the combination of the read head 102 with the disk 120 may be the primary subject of the test. Regardless of upon which component(s) the test is primarily focused, the test apparatus 100 practically tests the combination of the head 102 with the disk 120.

The test apparatus 100 may be used to test mechanical characteristics of the read head 102 (e.g. gas lubrication film properties and so-called "flying" characteristics). Alternatively or in addition, the test apparatus 100 may be used to test magnetic or electrical characteristics of the read head 102. In this case, the read head holder 130 may include a means for electrical connection to the read head 102 (e.g. conductive probe pins), and may include read/write electronics 154 to receive/send electrical signals to the read head 102. The read/write electronics 154 may also provide electrical signals to the read head 102 to control or drive other functions of the read head 102, such as microactuation and/or heat assisted writing.

The read/write electronics 154 may also provide servo signals to the motion control electronics 150, for use as position error feedback to enable precise closed-loop control of one or more of the stages and actuators that control the position of the read head 102 relative to the major surface 122 of the disk 120. Such precise control may be referred to as "fine" actuation of the read head 102.

Figure 7:
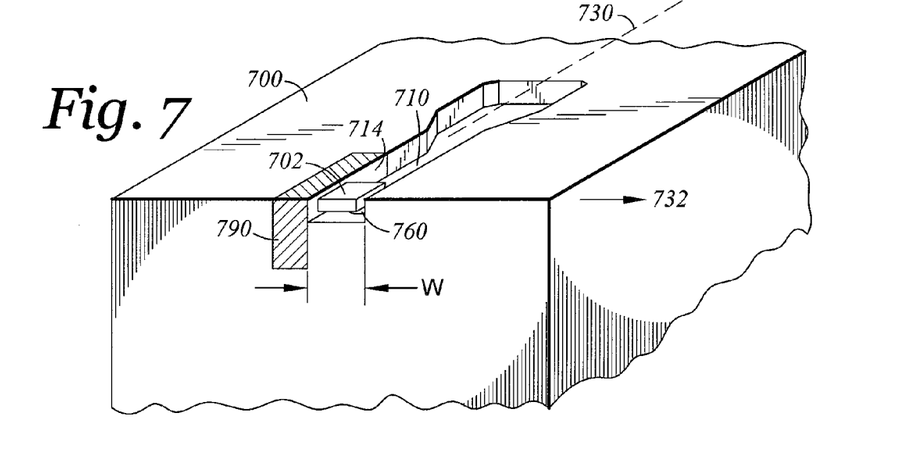
FIG. 7 is a perspective view of a portion of a read head holder of a test apparatus according to another embodiment of the present invention.
Figure 8:
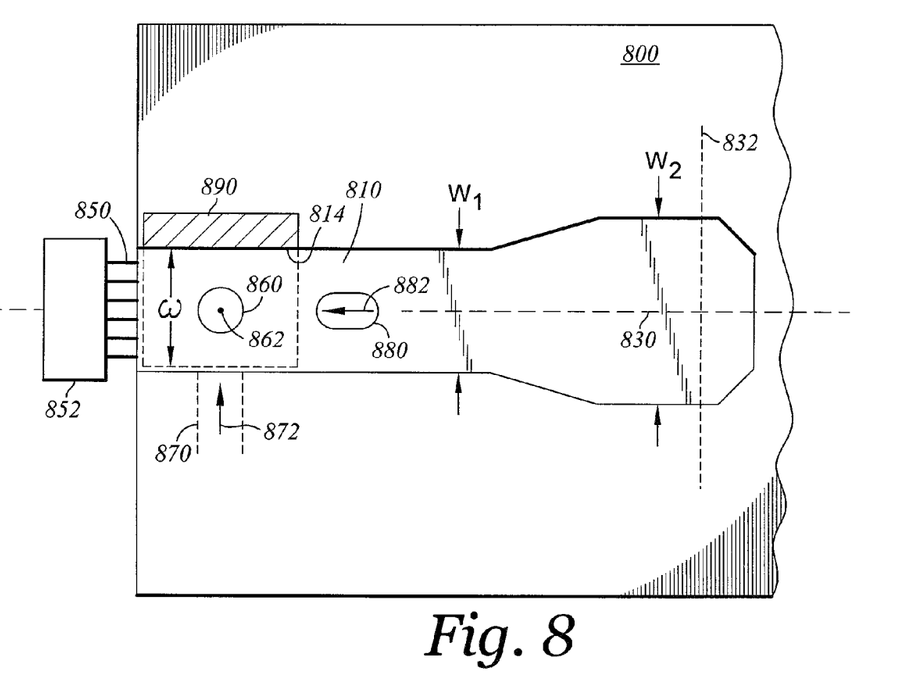
FIG. 8 is a plan view of a read head holder of a test apparatus according to another embodiment of the present invention.
Figure 9:
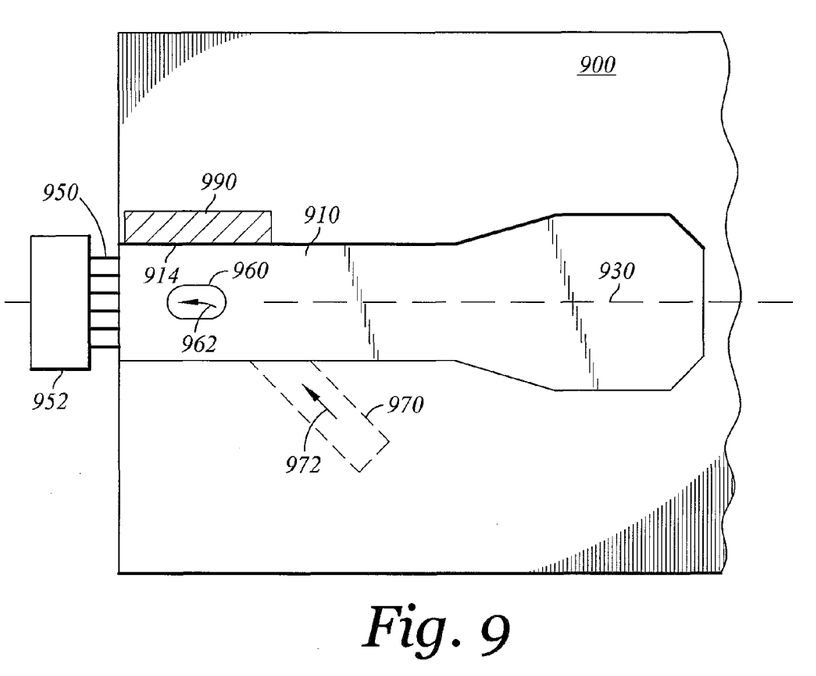
FIG. 9 is a plan view of a read head holder of a test apparatus according to another embodiment of the present invention.

Fine actuation may be enhanced by the addition of a fine positioning actuator to the read head holder 130. Although a fine positioning actuator is not shown in FIG. 1, examples are shown in FIGS. 7-9 herein. Referring again to FIG. 1, such a fine positioning actuator would be preferably disposed closer to the head 102 (so as to move less mass) than the translational and rotational stages 140, 142. Lesser moving mass may give the fine positioning actuator relatively higher bandwidth (but lesser stroke) in comparison with the translational and rotational stages 140, 142. Fine positioning bandwidth can be further increased by high stiffness construction of the fine positioning actuator (e.g. construction from a piezoelectric ceramic material).

Figure 2:
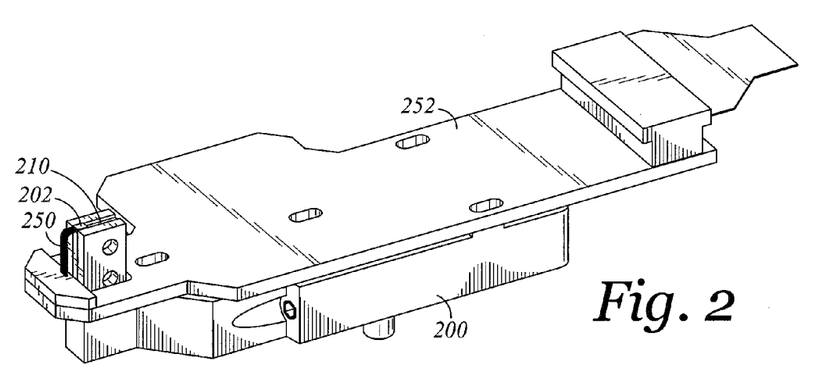
FIG. 2 is a perspective view of a read head holder of a test apparatus according to an embodiment of the present invention.

FIG. 2 is a perspective view of a read head holder 200 of a test apparatus according to an embodiment of the present invention. The read head holder 200 includes a channel 210 that is wide enough to receive a read head 202 under test. The read head holder 200 also includes a plurality of electrical probes 250 that are supported by a printed circuit board 252 that is attached to the read head holder 200. A tip of each of the plurality of electrical probes 250 contacts a trailing face of the read head 202. Each of the plurality of electrical probes 250 has a long slender "L" shape that may bend to provide mechanical compliance of the probe tip in a direction normal to the trailing face of the read head 202.

Figure 3:
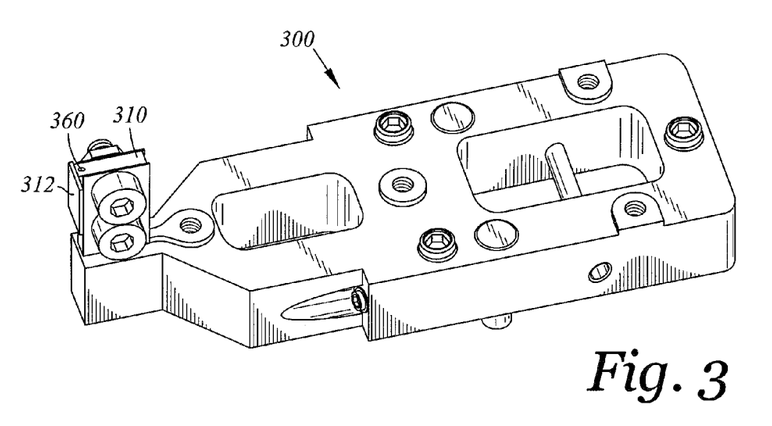
FIG. 3 is a perspective view of a read head holder of a test apparatus according to another embodiment of the present invention.

FIG. 3 is a perspective view of a read head holder 300 of a test apparatus according to another embodiment of the present invention. The read head holder 300 includes a channel 310 that includes a nozzle 360 to point a gas jet into the channel 310. The read head holder 300 also includes a limiting plate 312 that can contact a trailing face of a read head (not shown) in the channel 310, to limit the travel of the read head in a direction parallel to the channel 310.

Figure 4:
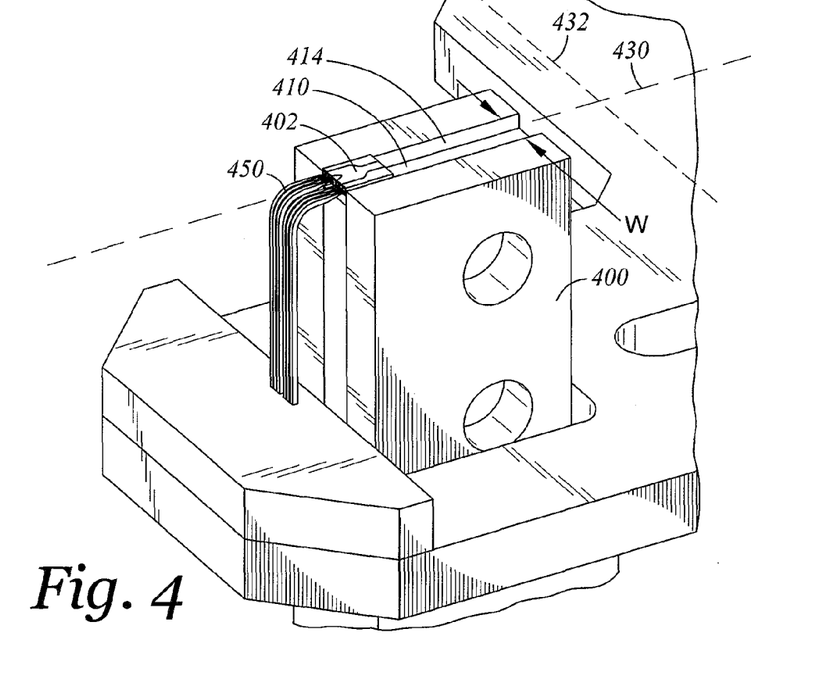
FIG. 4 is a perspective view of a portion of a read head holder of a test apparatus according to an embodiment of the present invention.

FIG. 4 is a perspective view of a portion of a read head holder 400 of a test apparatus according to an embodiment of the present invention. The read head holder 400 includes a channel 410 that has a first side wall 414. The channel 410 defines a channel longitudinal axis 430 that is parallel to the first side wall 414, and a lateral direction 432 that is normal to the first side wall 414. The read head holder 400 is oriented to hold a read head 402 with its air bearing surface (read head surface to which the numerical label 402 points in FIG. 4)

adjacent the major surface of a disk (not shown in FIG. 4 so that the read head 402 and the channel 410 are not obscured) during testing of the read head 402. The channel 410 has a channel width W measured in the lateral direction 432 that is greater than the width of the read head 402.

Although the first side wall 414 is depicted in FIG. 4 as a straight and flat side wall, it need not be. Rather, the first side wall 414 may include unevenness, curves, or protrusions, that may limit the region(s) of contact between the first side wall 414 and the read head 402. For example, the first side wall 414 may have curves or distinct protrusions into the channel 410 towards the longitudinal axis 430 (or recessions away from the longitudinal axis 430), that result in the head 402 contacting the first side wall 414 only along one or more line contact(s), and/or at a plurality of point contacts, and/or at one or more discontinuous sub-area(s) of contact. In this case, being "parallel" to the first side wall 414 is considered as being parallel to a plane that includes only the contact(s) with the head 402, without requiring parallelism everywhere with the first side wall 414.

In the embodiment of FIG. 4, the read head holder 400 further comprises a plurality of electrical probes 450 that are laterally aligned within the first channel width W and adapted to contact a trailing face of the read head 402. In this context, to be "laterally aligned within" a channel width does not require that the plurality of electrical probes are within the channel, but rather only that the tips of the plurality of electrical probes are positioned such that their lateral alignment falls within the lateral width of the channel (though the longitudinal position of the probes and/or probe tips may be outside of the channel).

Each of the plurality of electrical probes 450 optionally has a long slender "L" shape, with a bending resilience of the long slender "L" shape providing mechanical compliance in a direction parallel to the channel longitudinal axis 430. The plurality of electrical probes 450 may comprise an electrically conductive metal such as copper or stainless steel. In certain embodiments, each of the plurality of electrical probes 450 comprises beryllium copper and has a maximum cross-sectional thickness in the range 100 microns to 400 microns, and total length in the range 2 mm to 6 mm. In certain embodiments, such shape and dimensions of the plurality of electrical probes 450 help them make and/or maintain reliable electrical contact with a corresponding plurality of conductive bond pads on the trailing face of the read head 402.

Figure 5:
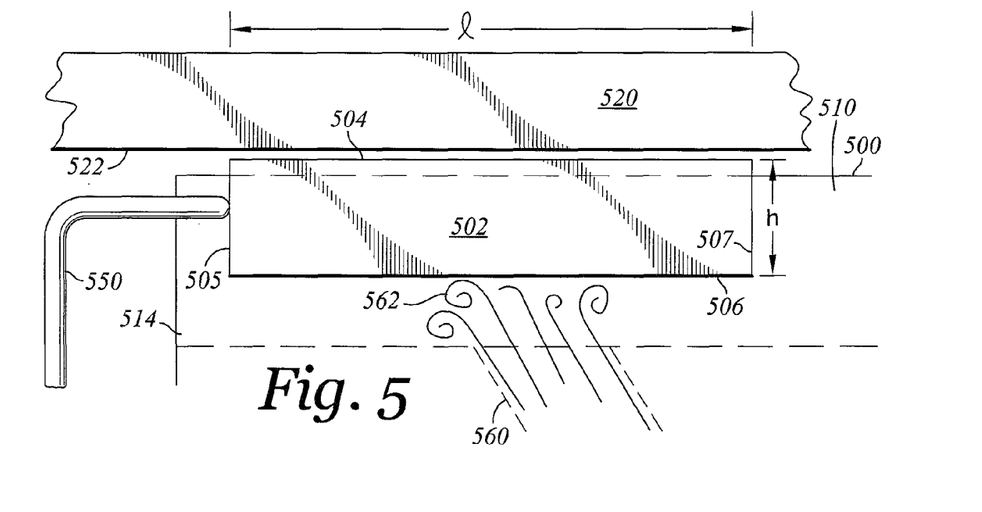
FIG. 5 is a side view of a read head - disk interface of a test apparatus according to an embodiment of the present invention.

FIG. 5 is a side view of a read head—disk interface of a test apparatus according to an embodiment of the present invention. The read head 502 in FIG. 5 defines a read head height h between an air bearing surface 504 and a read head top face 506. The read head 502 also defines a read head length l between a read head trailing face 505 and a read head leading face 507. In the context of FIG. 5, the dimension arrows that define the length l, also define a longitudinal direction. A read head holder 500 includes a channel 510 that has a first side wall 514 that is parallel to the longitudinal direction. In the embodiment of FIG. 5, the read head holder 500 is oriented to hold the read head 502 with its air bearing surface 504 adjacent a major surface 522 of a disk 520 during testing.

The read head holder 500 also includes a nozzle 560 that opens into the channel 510 and directs a first gas jet 562 to point into the channel 510 and impinge upon at least the read head top face 506. In this context, to "impinge upon" a read head surface means that the gas jet nozzle is oriented so that the moving gas of the gas jet collides with and contacts at least that read head surface, directly applying a force to that read head surface. An indirect transmission of force via some other interfering or intervening solid structure or component (e.g. disposed between the nozzle and the read head surface) is insufficient to meet the definition of "impinging upon" herein. Note that the gas jet need not continuously impinge upon the read head surface during operation. For example, the gas jet may impinge upon the read head surface initially (when the read head is loaded adjacent the disk major surface), but then the gas jet may be turned off once a hydrodynamic lubrication layer has been fully established between the read head and the disk major surface.

The first gas jet 562 may comprise air, for example. Alternatively, the first gas jet 562 may comprise a gas or gas mixture other than air, for example helium, nitrogen, and/or a mixture of helium and air. Such an alternative gas or gas mixture may be preferred for the first gas jet 562 during testing, in cases where the air bearing surface 504 has been designed for use with that gas or gas mixture during normal operation. In certain embodiments, the gas jet 562 may provide a means for simplified and automated loading/unloading the read head 502 on/off the major surface 522 of the disk 520 during testing. In certain embodiments, the gas jet 562 may provide a means to adjust a preload force (also known as the "gram load") that presses the read head 502 against the major surface 522 of the disk 520 during testing.

In the embodiment of FIG. 5, a plurality of electrical probes 550 contacts the trailing face 505 of the read head 502. Each of the plurality of electrical probes 550 has a long slender "L" shape, with a bending resilience of the long slender "L" shape providing mechanical compliance in a direction normal to the trailing face 505 of the read head 502 (i.e. the longitudinal direction). In certain embodiments, the gas jet 562 may also provide a force to longitudinally preload the read head 502 against the plurality of electrical probes 550, so that corresponding conductive bond pads on the trailing face 505 of the read head 502 will make reliable electrical contact with the plurality of electrical probes 550, enabling electrical signals to be communicated there between.

Figure 6A:
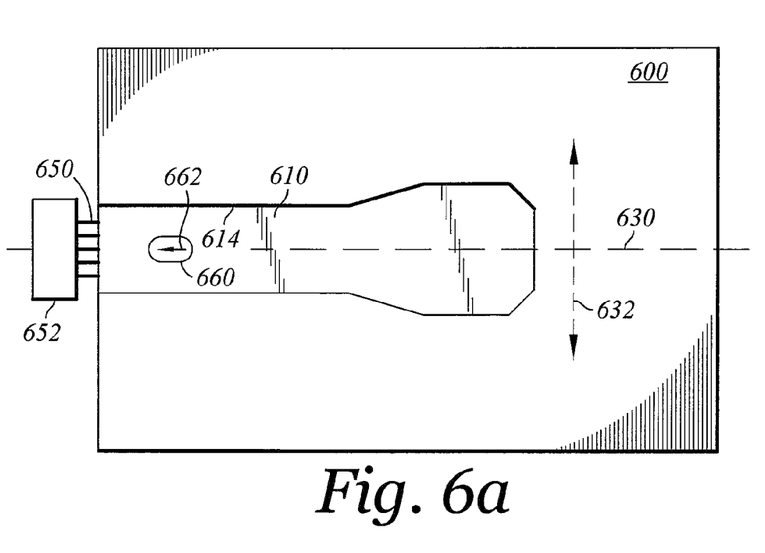
FIG. 6A is a plan view of a read head holder of a test apparatus according to an embodiment of the present invention, with no read head being held.
Figure 6B:
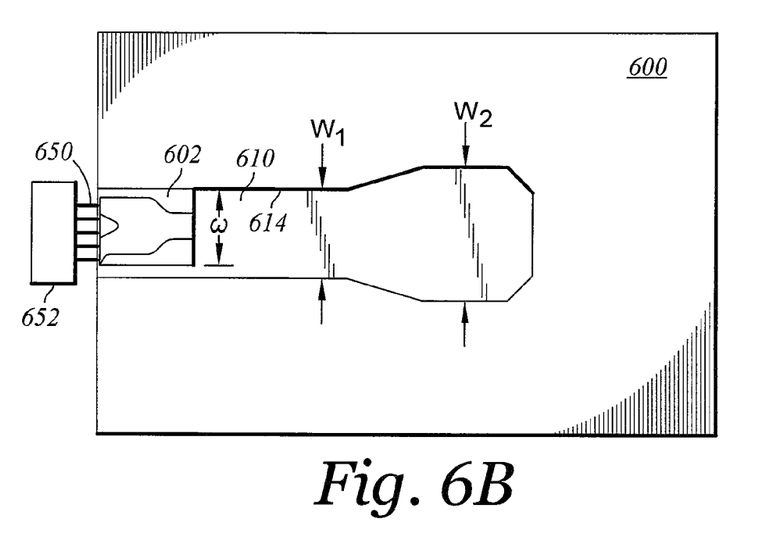
FIG. 6B is a plan view of a read head holder of a test apparatus according to an embodiment of the present invention, with a read head being held.

FIG. 6A is a plan view of a read head holder 600 of a test apparatus according to an embodiment of the present invention, with no read head being held. FIG. 6B is a plan view of the read head holder 600 with a read head 602 being held. Now referring to FIGS. 6A and 6B, the read head holder 600 includes a channel 610 that has a first side wall 614. The channel 610 defines a channel longitudinal axis 630 that is parallel to the first side wall 614, and a lateral direction 632 that is normal to the first side wall 614. The read head holder 600 is oriented to hold a read head 602 with its air bearing surface (read head surface to which the numerical label 602 points in FIG. 6B) adjacent the major surface of a disk (not shown in FIGS. 6A or 6B so that the read head 602 and the channel 610 are not obscured) during testing of the read head 602.

In the embodiment of FIGS. 6A and 6B, the channel 610 defines a first channel width $W_1$ measured in the lateral direction 632 that is greater than the width w of the read head 602. Note that the width w of the read head 602 is measured in the lateral direction from the side of the read head 602 that is in contact with the first side wall 614, to the opposite side of the read head 602. The channel 610 also optionally defines a second channel width $W_2$ measured in the lateral direction 632 that is at least 5 microns greater than the first channel width $W_1$.

The read head holder 600 also includes a nozzle 660 that opens into the channel 610, and that directs a first gas jet 662 to point into the channel 610 and to impinge upon at least a top face of the read head 602. The top face is the face of the read head 602 that is opposite its air bearing surface. Note that the air bearing surface is visible as the surface to which numerical label 602 points in FIG. 6B. Note also that although certain dimensions or component orientations of the claimed test apparatus are defined with respect to the read head under test, only the test apparatus (and not any read head under test) is claimed herein.

In the embodiment of FIGS. 6A and 6B, the read head holder 600 further comprises a printed circuit board 652 from which a plurality of electrical probes 650 extends. Each of the plurality of electrical probes 650 is laterally aligned within the first channel width $W_1$ and is adapted to contact a trailing face of the read head 602. Indeed each of the plurality of electrical probes 650 is shown to be in contact with the trailing face of the read head 602 in FIG. 6B. In certain embodiments, a lubricious coating may be disposed on the first side wall 614 to reduce friction the corresponding side of the read head 602. Such reduced friction may enhance the ability of the trailing face of the read head 602 to be longitudinally biased against the electrical probes 650 (for reliable electrical contact therewith).

FIG. 7 is a perspective view of a portion of a read head holder 700 of a test apparatus according to another embodiment of the present invention. The read head holder 700 includes a channel 710 that has a first side wall 714. The channel 710 defines a channel longitudinal axis 730 that is parallel to the first side wall 714, and a channel width W measured in a lateral direction 732 that is normal to the first side wall 714. The read head holder 700 is oriented to hold a read head 702 within the channel width, and with the air bearing surface of the read head (i.e. the read head surface to which the numerical label 702 points in FIG. 7) adjacent the major surface of a disk during testing of the read head 702. The disk is not shown in FIG. 7 so that the read head 702 and the channel 710 are not obscured.

In the embodiment of FIG. 7, the first side wall 714 comprises a conventional piezoelectric material 790 adapted to finely actuate the read head 702 in the lateral direction 732 by contact with a side of the read head 702. In this context, fine actuation is characterized by having lesser stroke but greater bandwidth than the coarse actuation of a positioning stage (e.g. positioning stage 140 of FIG. 1) to which the read head holder 700 may be attached. The piezoelectric material 790 may be a ceramic that comprises barium titanate or lead zirconate titanate, for example. The read head holder 700 also includes a nozzle 760 that opens into the channel 710, and that directs a gas jet to point into the channel 710 and to impinge upon at least a top face of the read head 702. The top face is the face of the read head 702 that is opposite its air bearing surface. Note that the air bearing surface is visible as the surface to which the numerical label 702 points in FIG. 7.

FIG. 8 is a plan view of a read head holder 800 of a test apparatus according to another embodiment of the present invention. The read head holder 800 includes a channel 810 that has a first side wall 814. The channel 810 defines a channel longitudinal axis 830 that is parallel to the first side wall 814, and a lateral direction 832 that is normal to the first side wall 814. In the embodiment of FIG. 8, the first side wall 814 comprises a conventional piezoelectric material 890 adapted to finely actuate first side wall 814 in the lateral direction 832, and thereby finely actuate a read head by contact of its side with the first side wall 814. Such a side contact position of the read head is denoted by a rectangle of width w, drawn with phantom lines in FIG. 8. The piezoelectric material 890 may be a ceramic that comprises barium titanate or lead zirconate titanate, for example.

In the embodiment of FIG. 8, the channel 810 defines a first channel width $W_1$ measured in the lateral direction 832 that is greater than the width w of the read head under test. The channel 810 also optionally defines a second channel width $W_2$ measured in the lateral direction 832 that is at least 5 microns greater than the first channel width $W_1$. The read head holder 800 also includes a first nozzle 860 that opens into the channel 810, and that directs a first gas jet 862 to point into the channel 810 and to impinge upon at least a top face of the read head under test. For example, the first gas jet 862 is optionally directed to point out of the page and normal to the page in FIG. 8, though the first gas jet 862 alternatively may be directed towards the top face of the read head under test at an angle that is skewed relative to the page in FIG. 8. The first gas jet nozzle 860 may include a hole within the channel 810 that preferably but not necessarily has a hole diameter in the range 0.2 mm to 1 mm.

In the embodiment of FIG. 8, the read head holder 800 further comprises a printed circuit board 852 from which a plurality of electrical probes 850 extends. Each of the plurality of electrical probes 850 is laterally aligned within the first channel width $W_1$ and is adapted to contact a trailing face of the read head under test. The read head holder 800 also optionally includes a second nozzle 880 that opens into the channel 810 at a location upstream of the head under test. In this context, a location is considered to be "upstream" if a point on the disk surface passes it (due to rotation of the disk) before passing the leading face of the head under test. The second nozzle 880 directs a second gas jet 882 to point into the channel 810 upstream of the head under test.

In certain embodiments, the second gas jet 882 may impinge upon at least the leading face of the read head under test. Such impingement may provide a force to longitudinally preload the read head under test against the plurality of electrical probes 850, so that corresponding conductive bond pads on the trailing face of the read head under test will make reliable electrical contact with the plurality of electrical probes 850.

In certain alternative embodiments, the second gas jet 882 may not be directed to impinge upon the leading face of the read head under test, but rather acts merely to create a higher gas pressure in a region of the channel that is upstream of the leading face of the read head under test. Such higher upstream pressure may longitudinally preload the read head under test against the plurality of electrical probes 850, so that corresponding conductive bond pads on the trailing face of the read head under test will make reliable electrical contact with the plurality of electrical probes 850.

In the embodiment of FIG. 8, the read head holder 800 also optionally includes a third nozzle 870 that opens into the channel 810, and that directs a third gas jet 872 to point into the channel 810 and impinge upon at least a side of the read head that is opposite the side that contacts the first side wall 814. The third gas jet 872 may laterally bias the read head under test against the first side wall 814 to improve the symmetry of actuation. Alternatively or in addition, the read head holder 800 may be skewed in the plane of the disk, so that the channel 810 is not parallel to a local tangent to the relative disk surface motion (due to disk rotation), so that gas shear force between the head and the disk tends to laterally bias the read head under test against the first side wall 814.

FIG. 9 is a plan view of a read head holder 900 of a test apparatus according to another embodiment of the present invention. The read head holder 900 includes a channel 910 that has a first side wall 914. The channel 910 defines a channel longitudinal axis 930 that is parallel to the first side wall 814. In the embodiment of FIG. 9, the first side wall 914 comprises a conventional piezoelectric material 990 adapted to finely actuate first side wall 914 in a direction normal to the first side wall 914, and thereby finely actuate a read head by contact of its side with the first side wall 914.

In the embodiment of FIG. 9, the read head holder 900 includes a first nozzle 960 that opens into the channel 910, and that directs a first gas jet 962 to point into the channel 910 and to impinge upon at least a top face of a read head under test. The read head holder 900 further comprises a printed circuit board 952 from which a plurality of electrical probes 950 extends. Each of the plurality of electrical probes 950 is adapted to contact a trailing face of a read head under test. The read head holder 900 also optionally includes a second nozzle 970 that opens into the channel 910, and that directs a second gas jet 972 to point into the channel 910 and impinge upon both the leading face and a side face of the read head under test. In certain embodiments, the second gas jet 972 may provide a force to longitudinally preload the read head under test against the plurality of electrical probes 950, and also to laterally bias the read head under test to register against the first side wall 914.

Figure 10:
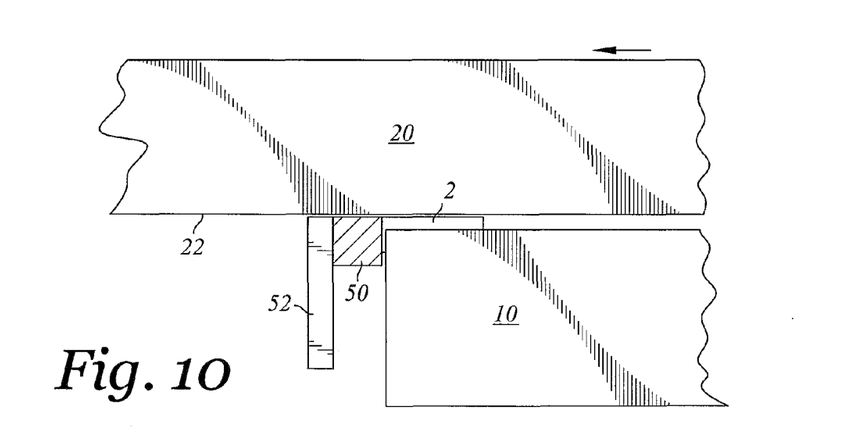
FIG. 10 is a side view of a read head - disk interface of a test apparatus according to another embodiment of the present invention.

FIG. 10 is a side view of a read head - disk interface of a test apparatus according to another embodiment of the present invention. In the embodiment of FIG. 10, a read head holder 10 is oriented to hold a read head 2 with its air bearing surface adjacent a major surface 22 of a disk 20 during testing. Rotation of the disk 20 may cause the surface 22 to locally translate (relative to the read head 2) in the direction indicated by the arrow in FIG. 10. The test apparatus of FIG. 10 may include a printed circuit board 52 from which an elastomeric material 50 having anisotropic conductivity extends. Compressive resilience of the elastomeric material 50 may provide compliance normal to the trailing face of the read head under test. Various sub-regions of the elastomeric material 50 may be in contact with individual conductive bond pads on the trailing face of the slider. Because the elastomeric material 50 has anisotropic conductivity (a preferred direction of electrical conductance), such sub-regions may function as a plurality of conductive probes that are not necessarily electrically shorted together.

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

I claim:

1. A test apparatus to test a read head, the read head defining a read head height between an air bearing surface and a read head top face, the read head also defining a read head width between a first read head side and a second read head side, the read head also defining a read head length between a read head trailing face and a read head leading face, the test apparatus comprising:
    a rotatable spindle;
    a disk attached to the rotatable spindle, the disk including a major surface; and
    a holder oriented to hold the read head with its air bearing surface adjacent the major surface of the disk during testing, the holder comprising:
        a channel including a first side wall and defining a channel longitudinal axis parallel to the first side wall, the channel defining a lateral direction that is normal to the first side wall, the read head disposed at least partially within the channel;
        a first gas jet pointing into the channel and impinging upon the read head top face.

2. The test apparatus of claim 1 wherein the channel has a first channel width measured in the lateral direction that is greater than the read head width.

3. The test apparatus of claim 2 wherein the holder further comprises a plurality of electrical probes that are laterally aligned within the first channel width and oriented to contact the read head trailing face.

4. The test apparatus of claim 3 wherein the plurality of electrical probes are mechanically compliant in a direction parallel to the channel longitudinal axis.

5. The test apparatus of claim 4 wherein each of the plurality of electrical probes has a long slender "L" shape, with a bending resilience of the long slender "L" shape providing said mechanical compliance.

6. The test apparatus of claim 5 wherein each of the plurality of electrical probes comprises beryllium copper and has a maximum cross-sectional thickness in the range 100 microns to 400 microns, and total length in the range 2 mm to 6 mm.

7. The test apparatus of claim 4 wherein each of the plurality of electrical probes is a region of an elastomeric material having anisotropic conductivity, with a compressive resilience of the elastomeric material providing said mechanical compliance.

8. The test apparatus of claim 1 wherein the first side wall includes a piezoelectric material in contact with the first read head side, for finely actuating the read head in the lateral direction.

9. The test apparatus of claim 8 further comprising a stage for coarse translation in the lateral direction, and wherein the holder is attached to the stage.

10. The test apparatus of claim 1 further comprising a second gas jet pointing into the channel and impinging upon the read head leading face.

11. The test apparatus of claim 10 further comprising a third gas jet pointing into the channel and impinging upon the second read head side.

12. The test apparatus of claim 1 wherein the holder is oriented relative to the disk so that rotation of the disk laterally biases the read head against the first side wall.

13. The test apparatus of claim 1 wherein the first gas jet passes through a first gas jet nozzle, and wherein the first gas jet nozzle is coupled to a gas pressure source that selectively provides super-ambient pressure to drive the first gas jet.

14. The test apparatus of claim 13 wherein the gas pressure source selectively provides sub-ambient pressure.

15. The test apparatus of claim 13 wherein the first gas jet nozzle includes a hole within the channel, the hole having a hole diameter in the range 0.2 mm to 1 mm.

16. A test apparatus to test a read head and a disk, the read head defining a read head height between an air bearing surface and a read head top face, the read head also defining a read head width between a first read head side and a second read head side, the read head also defining a read head length between a read head trailing face and a read head leading face, the disk including a major surface, the test apparatus comprising:
    a rotatable spindle for holding the disk;
    a holder oriented to hold the read head with its air bearing surface adjacent the major surface of the disk during testing, the holder comprising:

a channel including a first side wall and defining a channel longitudinal axis parallel to the first side wall, the channel defining a lateral direction that is normal to the first side wall;

a first gas jet pointing into the channel and impinging upon the read head top face.

17. The test apparatus of claim 16 wherein the channel defines a first channel width measured in the lateral direction that is greater than the read head width, and wherein the holder further comprises a plurality of electrical probes that are laterally aligned within the first channel width and oriented to contact the read head trailing face.

18. The test apparatus of claim 16 further comprising a second gas jet pointing into the channel and impinging upon the read head leading face.

19. The test apparatus of claim 18 further comprising a third gas jet pointing into the channel and impinging upon the second read head side.

20. The test apparatus of claim 19 wherein the channel defines a second channel width measured in the lateral direction that is at least 5 microns greater than the first channel width.

* * * * *